(12) United States Patent
Bijlani et al.

(10) Patent No.: US 11,403,664 B2
(45) Date of Patent: Aug. 2, 2022

(54) GENERATING AESTHETICS AND SAFETY INFORMATION FOR BILLBOARD MARKETING

(71) Applicant: INTERNATIONAL BUSINESS MACHINES CORPORATION, Armonk, NY (US)

(72) Inventors: Vinod Bijlani, Singapore (SG); Manna Sui, Singapore (SG)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 107 days.

(21) Appl. No.: 16/298,287

(22) Filed: Mar. 11, 2019

(65) Prior Publication Data
US 2020/0294085 A1 Sep. 17, 2020

(51) Int. Cl.
*G06Q 30/02* (2012.01)
*G09F 15/00* (2006.01)
*G06F 30/17* (2020.01)

(52) U.S. Cl.
CPC ......... *G06Q 30/0245* (2013.01); *G06F 30/17* (2020.01); *G06Q 30/0246* (2013.01); *G06Q 30/0276* (2013.01); *G09F 15/0006* (2013.01)

(58) Field of Classification Search
CPC combination set(s) only.
See application file for complete search history.

(56) References Cited

U.S. PATENT DOCUMENTS

| 6,453,056 | B2 | 9/2002 | Laumeyer | |
|---|---|---|---|---|
| 9,047,256 | B2 | 6/2015 | Carlson | |
| 2001/0043718 | A1 | 11/2001 | Laumeyer et al. | |
| 2004/0128891 | A1* | 7/2004 | Keach | G09F 15/00 40/624 |
| 2011/0267344 | A1* | 11/2011 | Germann | G06V 20/64 382/154 |
| 2015/0227965 | A1 | 8/2015 | Drysch | |
| 2015/0294347 | A1 | 10/2015 | Placide | |

(Continued)

FOREIGN PATENT DOCUMENTS

| WO | 2011037862 A1 | 3/2011 |
|---|---|---|
| WO | 2014111874 A1 | 7/2014 |

OTHER PUBLICATIONS

Levi Lynch, Digital Billboard, University of Cincinnati College of Applied Science (Year: 2011).*

(Continued)

*Primary Examiner* — E Carvalho
(74) *Attorney, Agent, or Firm* — Douglas M. Crockatt (57) ABSTRACT

A method, computer system, and computer program product for billboard aesthetics and safety rating generator are provided. The embodiment may include receiving, by a processor, a plurality of information related to a billboard. The embodiment may also include extracting specific billboard information from the received data. The embodiment may further include generating ratings on safety, aesthetics and legal conformance levels of the extracted billboard information. The embodiment may also include generating a 3D model of the billboard that incorporates updates based on the generated ratings. The embodiment may further include generating improvement recommendations designed to increase the generated ratings.

17 Claims, 6 Drawing Sheets

(56) References Cited

U.S. PATENT DOCUMENTS

| | | | | |
|---|---|---|---|---|
| 2015/0363828 | A1* | 12/2015 | Mantalovos | G08G 1/0141 705/14.58 |
| 2016/0292713 | A1* | 10/2016 | Chen | G06Q 30/0242 |
| 2018/0240379 | A1* | 8/2018 | Carolan | G09F 15/005 |

OTHER PUBLICATIONS

Dongyu Liu et al., SmartAdP: Visual Analytics of Large-scale Taxi Trajectories for Selecting Billboard Locations, IEEE Transactions on Visualization And Computer Graphics, vol. 23, No. 1 (Year: 2017).*

Khizer Ahmed Siddiqui et al., Effect of Size, Location and Content of Billboards on Brand Awareness, Journal of Business Studies Quarterly, vol. 8, No. 2 (Year: 2016).*

Marciano, et al., "The Effect of Billboard Design Specifications on Driving: A Pilot Study", vol. 104, Received Nov. 13, 2016; Received in revised form Mar. 27, 2017; Accepted Apr. 27, 2017, Available online May 20, 2017, https://www.ncbi.nlm.nih.gov/pubmed/28535478, pp. 174-184.

Singh, "The Future of Outdoor Advertising", Linkedin, Published on Sep. 8, 2016, https://www.linkedin.com/pulse/future-outdoor-advertising-katie-stewart?trk=hp-feed-article-title-like, pp. 1-9.

Mell et al., "The NIST Definition of Cloud Computing", National Institute of Standards and Technology, Special Publication 800-145, Sep. 2011, pp. 1-7.

American Planning Association, "APA Policy Guide on Billboard Controls", https://www.planning.org/policy/guides/adopted/billboards.htm, accessed Mar. 11, 2019, pp. 1-7.

Bejranonda et al., "Aesthetic damage Values of Urban Billboards", Article in Kasetsart Journal—Social Sciences, Jan. 2013, Abstract Only, pp. 1-5, https://www.researchgate.net/publication/288577481_Aesthetic_damage_values_of_urban_billboards.

Ocallaghan, "Dublin takes legal action on city billboards", The Sunday Times, Jul. 27, 2003, https://www.thetimes.co.uk/article/dublin-takes-legal-action-on-city-billboards-wl5q22h36qj, pp. 1-5.

\* cited by examiner

GENERATING AESTHETICS AND SAFETY INFORMATION FOR BILLBOARD MARKETING

BACKGROUND

The present invention relates, generally, to the field of computing, and more particularly to marketing optimization.

A billboard is a large outdoor advertising structure, typically, built in high-traffic areas to present large advertisements to passing people. Large-sized billboards are highly visible from a distance and most billboards are located on a busy highway or in an area where there are many prospective customers to maximize the advertising effects. A digital billboard is another popular form of billboard advertising. Digital billboards can show varying imagery and text created from computer programs and software. Digital billboards can be programmed to display constantly changing texts and even provide several different advertising imageries or texts at a pre-configured interval.

SUMMARY

According to one embodiment, a method, computer system, and computer program product for billboard aesthetics and safety rating generator are provided. The embodiment may include receiving, by a processor, a plurality of information related to a billboard. The embodiment may also include extracting specific billboard information from the received data. The embodiment may further include generating ratings on safety, aesthetics and legal conformance levels of the extracted billboard information. The embodiment may also include generating a 3D model of the billboard that incorporates updates based on the generated ratings. The embodiment may further include generating improvement recommendations designed to increase the generated ratings.

BRIEF DESCRIPTION OF THE SEVERAL VIEWS OF THE DRAWINGS

These and other objects, features, and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to the field of computing, and more particularly to marketing optimization. The following described exemplary embodiments provide a system, method, and program product to analyze surrounding information and generate aesthetics and safety ratings for all billboards in a city or highway. Therefore, the present embodiment has the capacity to improve the technical field of billboard safety, aesthetics and conformance audit system by providing an automated ratings generation system.

As previously described, a billboard relates to a large outdoor advertising structure built in high-traffic areas to present large advertisements to passing people. Large-sized billboards are highly visible from a distance and most billboards are located on a busy highway or in an area where there are many prospective customers to maximize the advertising effects. A digital billboard is another popular form of billboard advertising. Digital billboards can show varying imagery and text created from computer programs and software. Digital billboards can be programmed to display constantly changing texts and even provide several different advertising imageries or texts at a pre-configured interval.

Billboards and digital signs greatly impact brand awareness and influences purchase decisions. However, with the currently existing systems, it is challenging to track how billboards meet the aesthesis and safety standards defined by the governments. Sometimes billboards affect the visual character, scenic resources, views, highways, and sources of light, often resulting in visual distraction. Some billboards may affect the visibility of traffic signs or signals which can have a severe impact on road safety. Generally, city authorities today have to physically audit billboards to check if they conform with local regulations. Also, advertisers have difficulties in determining whether their advertisements (i.e. billboards) address and conform with all the safety-related regulations or ordinances promulgated by the local authorities. As such, it may be advantageous to, among other things, implement a system capable of creating a 3D billboard model, integrating the model with local authority's regulation plans and processing safety, aesthetics and conformance ratings, so that the system can provide advertisers with better tools to conform with local regulations when advertising using billboards.

According to one embodiment, a billboard aesthetics and safety rating generation system may gather data coming from connected cars through an external or internal camera, current and historical traffic data, weather data, driver information, retail data, and other data sources to generate key metadata required for understanding aesthetics and safety aspects associated with billboards. In at least one embodiment, the billboard aesthetics and safety rating generation system may automatically generate a billboard aesthetics and safety ratings based on location and crowdsourcing model where citizens may upload pictures of billboards or digital signs. In at least one other embodiment, the billboard aesthetics and safety rating generation system may provide recommendations on image, colors, sizing, lighting, and content displayed on the signs.

The present invention may be a system, a method, and/or a computer program product at any possible technical detail level of integration. The computer program product may include the computer readable storage medium (or media) having computer readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer-readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or another device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product for generating billboard aesthetics and safety conformance ratings and providing recommendations to improve billboard advertisements.

Figure 1:
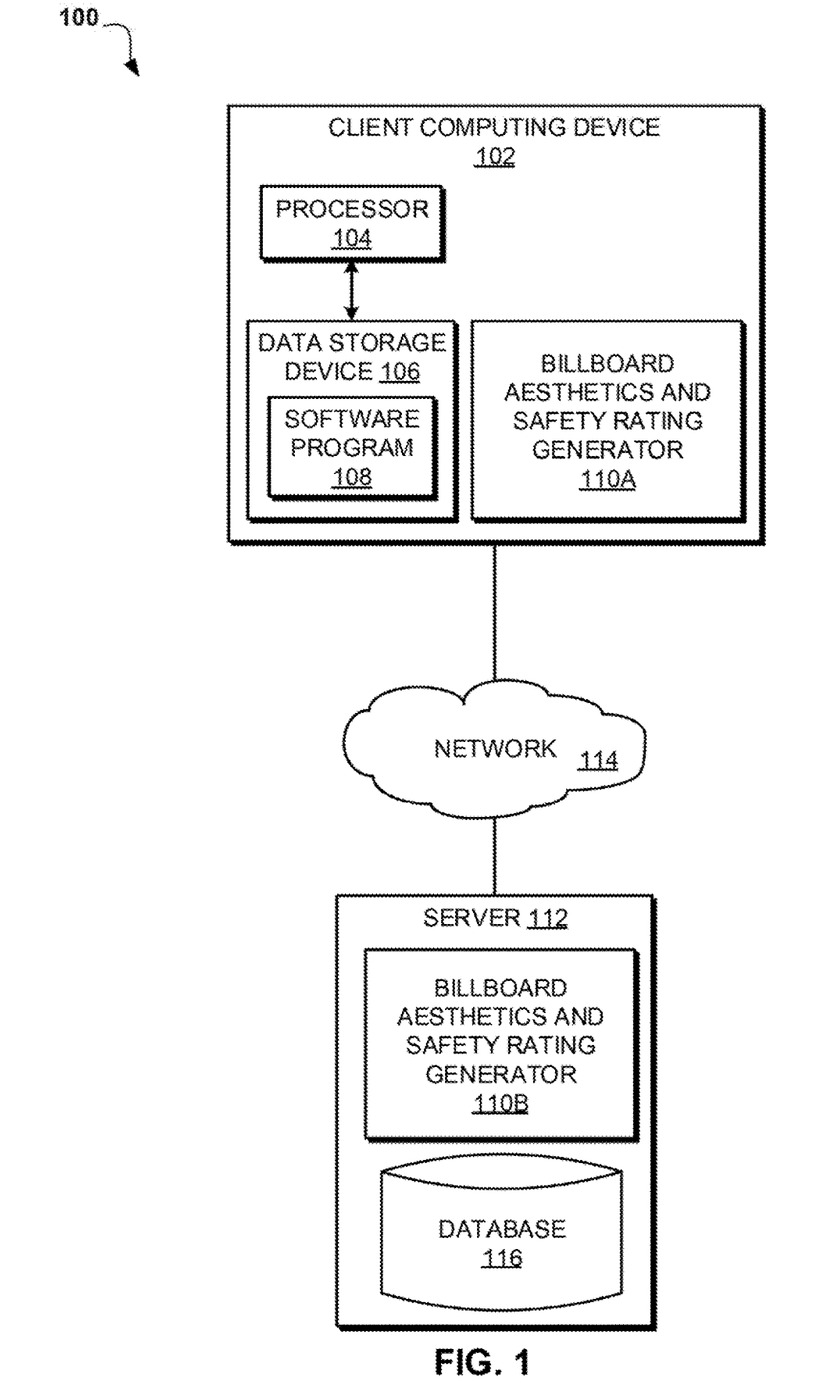
FIG. 1 illustrates an exemplary networked computer environment according to at least one embodiment.

Referring to FIG. 1, an exemplary networked computer environment 100 is depicted, according to at least one embodiment. The networked computer environment 100 may include client computing device 102 and a server 112 interconnected via a communication network 114. According to at least one implementation, the networked computer environment 100 may include a plurality of client computing devices 102 and servers 112 of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Client computing device 102 may include a processor 104 and a data storage device 106 that is enabled to host and run a software program 108 and a billboard aesthetics and safety rating generator 110A and communicate with the server 112 via the communication network 114, in accordance with one embodiment of the invention. Client computing device 102 may be, for example, a mobile device, a telephone, a personal digital assistant, a netbook, a laptop computer, a tablet computer, a desktop computer, or any type of computing device capable of running a program and accessing a network. As will be discussed with reference to FIG. 4, the client computing device 102 may include internal components 402a and external components 404a, respectively.

The server computer 112 may be a laptop computer, netbook computer, personal computer (PC), a desktop computer, or any programmable electronic device or any network of programmable electronic devices capable of hosting and running a billboard aesthetics and safety rating generator 110B and a database 116 and communicating with the client computing device 102 via the communication network 114, in accordance with embodiments of the invention. As will be discussed with reference to FIG. 4, the server computer 112 may include internal components 402b and external components 404b, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

According to the present embodiment, the billboard aesthetics and safety rating generator 110A, 110B may be a program capable of collecting and analyzing data related to surroundings of billboards from cameras connected to cars, current and historical traffic data, weather information, and other various sources to generate metadata required for assessing particular billboards conformance level against local government regulations or standards. The billboard aesthetics and safety rating generator 110A, 110B may also generate 3D models of improved billboards and simulate the conditions around the billboards, such as traffic, weather and surroundings. The billboard aesthetics and safety rating generation process is explained in further detail below with respect to FIG. 2.

Figure 2:
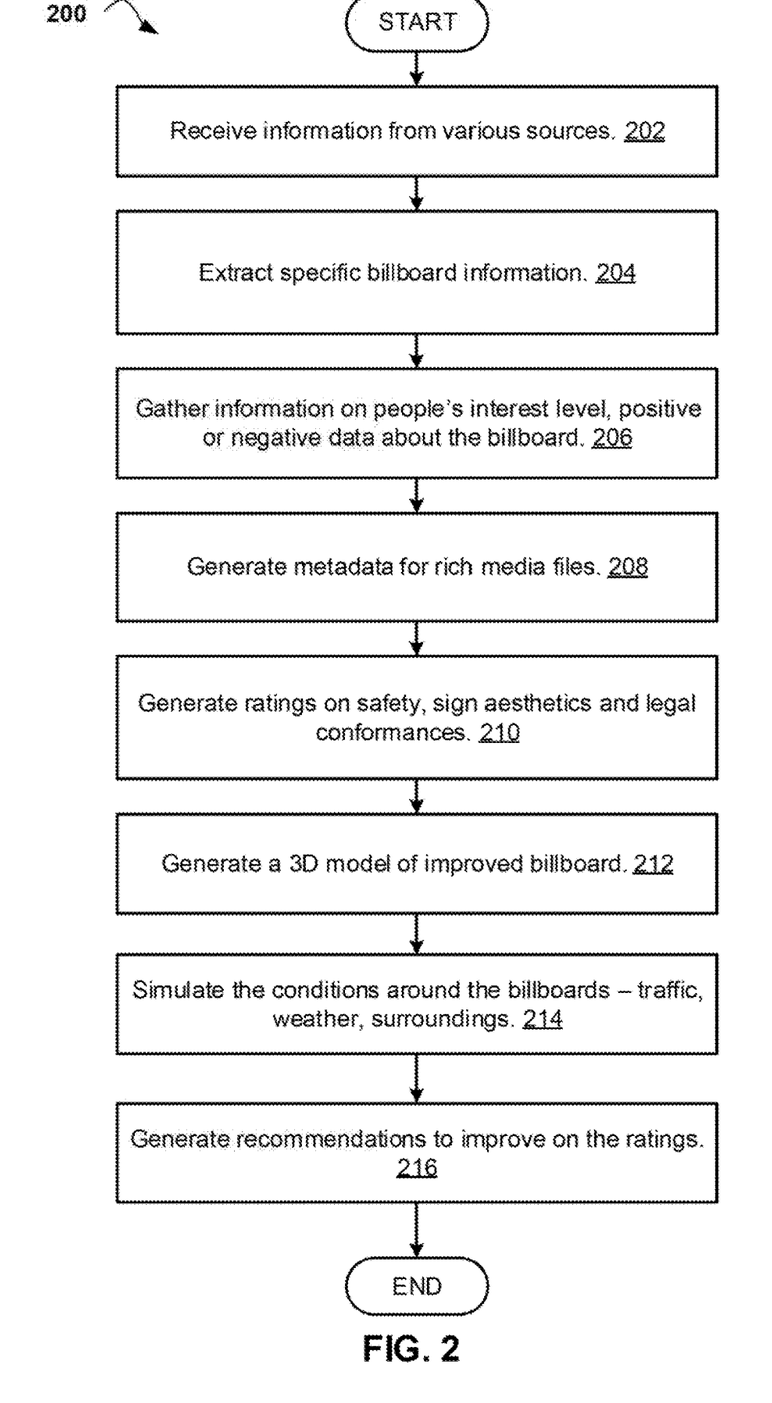
FIG. 2 is an operational flowchart illustrating a billboard aesthetics and safety information generation process according to at least one embodiment.

FIG. 2 is an operational flowchart illustrating a billboard aesthetics and safety rating generation process 200 according to at least one embodiment. At 202, the billboard aesthetics and safety rating generator 110A, 110B receives information from various sources. According to one embodiment, the billboard aesthetics, and safety rating generator 110A, 110B may fuse data coming from cameras connected to cars, city cameras, citizen uploaders and social media sites. For example, with respect to a designated auditor car, ordinary citizens or government employees may drive a car with an external camera to gather information from the streets on viewing of billboards or digital signs and make possible comments or preliminary ratings about those billboards or digital signs. The billboard aesthetics and safety rating generator 110A, 110B may also receive video or image data from social media sites regarding the same billboards in the same town so that the billboard aesthetics and safety rating generator 110A, 110B may analyze and compare the data with the information received from different sources regarding the same billboards in a later step.

At 204, the billboard aesthetics and safety rating generator 110A, 110B extracts specific billboard information. According to one embodiment, the billboard aesthetics and safety rating generator 110A, 110B may extract information related to billboards from the received video and image data. The billboard aesthetics and safety rating generator 110A, 110B may calculate the size of the billboard signs from the video or image files or scan the words and images of the billboard signs. According to another embodiment, the billboard aesthetics and safety rating generator 110A, 110B may extract billboard locations from the received video and GPS data provided by auditor camera, connected cars, citizens or social media sites. For example, video uploaded by citizens using a native app published by the municipalities may be utilized to get feedback on city or a city auditor car equipped with cameras which can record all the city billboards.

At 206, the billboard aesthetics and safety rating generator 110A, 110B gathers information on people's interest level, positive or negative data about certain billboards. According to one embodiment, the billboard aesthetics, and safety rating generator 110A, 110B may extract data related to people's interest level regarding a certain billboard from video data. For example, when a person uploads a video file capturing the movement of the person as the person walks in the city on a social media site, the billboard aesthetics and safety rating generator 110A, 110B may analyze the video file and determine whether the person made particular comments about a particular billboard when the person was looking at or determine the duration of time for which the person was gazing at a particular billboard. In at least one other embodiment, the billboard aesthetics and safety rating generator 110A, 110B may determine a person's interest level and compare it to pre-configured threshold information (e.g. duration of gazing at a billboard, number of positive or negative comments made about a certain billboard, etc). The billboard aesthetics and safety rating generator 110A, 110B may store all the video, images, social media, associated citizen feedback about the billboard (positive or negative) in a database or big data repository.

At 208, the billboard aesthetics and safety rating generator 110A, 110B generates metadata for rich media files collected from the connected car systems. According to one embodiment, the billboard aesthetics and safety rating generator 110A, 110B may capture billboard images, characteristics of a town or a city in which a billboard is located, location information of a billboard, people's comments about billboards and generate metadata. The generated metadata may include time-stamped tags, categories, topics, named entities, geo-location information, and tagged thumbnails. In at least one other embodiment, the billboard aesthetics and safety rating generator 110A, 110B may automatically generate metadata for rich media files.

At 210, the billboard aesthetics and safety rating generator 110A, 110B generates ratings on safety, aesthetics and legal conformance. According to one embodiment, the billboard aesthetics and safety rating generator 110A, 110B may include three components: 1) a safety rating component; 2) a sign aesthetics rating component, and 3) a conformance rating component. The safety rating component may include a hierarchical decision model where the driver's attention span for a specific billboard may be calculated and logged against a particular time of a day. The safety rating component may also be integrated with weather and lighting information related to a billboard. In at least one other embodiment, the billboard aesthetics and safety rating generator 110A, 110B may generate a rating based on the following metrics: attention time measured in seconds, number of views of a billboard, traffic conditions, road design, number of billboards in given location and viewing angles. The rating may be based on a linear combination of the metric values with coefficients. According to one other embodiment, historical data of safety record around a billboard may be included in the metrics. This data may be correlated with any historical driving record of a driver to determine if and how drivers may be impacted by a particular billboard. Data from a similar billboard may also be utilized in the component. A similar billboard may be one that either shows the same advertisements or is placed in a similar context (e.g. a billboard placed in similar physical environments or similar traffic or similar demographics). Multiple models including analytics, machine learning, and deep learning models may be created to provide for analyzing the above data. A weight may be given to different results obtained as some may be more significant than others and a final weighted average may be obtained. The billboard safety rating generator 110A, 110B may generate a rating using the final weighted average.

The sign aesthetics rating component may utilize images, video data from social media sites, and physical context of a billboard (e.g. placed in a high traffic area.) to generate aesthetic ratings either quantitively or qualitatively. The billboard aesthetics and safety rating generator 110A, 110B may use the following metrics to generate the ratings: size of a billboard sign, content, location significance, local language, and location background. All metrics may not have an equal impact on the calculation of aesthetics ratings. Multiple modules using analytics, machine learning, and deep learning models may be created to define what an aesthetically pleasing billboard may look like. The billboard aesthetics and safety rating generator 110A, 110B may train the models to identify visually good or bad billboards and continuously receive feedback to improve the models. In another embodiment, the billboard aesthetics and safety rating generator 110A, 110B may implement an impact bar graph that may indicate the extent of influence and relative impact that each metric or parameter may have on billboard aesthetics. The billboard aesthetics and safety rating generator 110A, 110B may also continuously receive social media metadata to associate the above metrics or parameters with any new positive or negative trends regarding a particular billboard.

The conformance rating component may utilize multiple models which gather regulatory and contractual information regarding a location and surrounding information. the billboard aesthetics and safety rating generator 110A, 110B may then connect to metadata to extract key metrics, such as location coordinates, image color, image, text, size, and determines whether a billboard conforms to legal and other contractual requirements. Cognitive technologies may be utilized to extract appropriate regulatory and contractual obligations an advertising company may have with respect to a billboard. For example, the billboard aesthetics and safety rating generator 110A, 110B may monitor how long and how many times individuals have viewed a particular billboard and utilize video system to confirm those numbers as certain contractual agreements may include a basis of calculation of adverting fees associated with such information.

At 212, the billboard aesthetics and safety rating generator 110A, 110B generates a 3D model of the improved billboard. According to one embodiment, the billboard aesthetics, and safety rating generator 110A, 110B may provide a user with GIS and 3D interface to accurately locate and visualize a billboard in question (i.e. the billboard with the generated ratings). the billboard aesthetics and safety rating generator 110A, 110B may also enable a user to define billboard dimensions and upload the new image designed for the billboard. The user may also modify the environment around the billboard if possible. For example, an advertising company may receive safety, aesthetics and conformance ratings generated in previous steps and design or improve the existing billboard to resolve the discovered safety, aesthetics and conformation issues. The billboard aesthetics and safety rating generator 110A, 110B may then create a 3D model of the improved billboard and display it to the user for verification.

At 214, the billboard aesthetics and safety rating generator 110A, 110B simulates the conditions around the billboards such as traffic, weather, and surroundings. According to one embodiment, the billboard aesthetics, and safety rating generator 110A, 110B may run the improved model of a billboard so that a user may then run the simulation to validate it. In at least one other embodiment, the billboard aesthetics and safety rating generator 110A, 110B may simulate the surrounding conditions. For example, when a user runs the improved model of the billboard, the billboard aesthetics, and safety rating generator 110A, 110B may display expected traffic and surrounding conditions (pedestrians, bicycles, etc.) and typical weather during a day, so that a user may assess how a newly designed or improved billboard may actually look in the real world. In another embodiment, the billboard aesthetics and safety rating generator 110A, 110B may run the simulation model and reuse the safety, aesthetics and conformance ratings to provide the required ratings for user approval. For example, if a newly designed or improved billboard receives better ratings than the original billboard, a user may predetermine that the new billboard will conform with all the regulations or local rules.

At 216, the billboard aesthetics and safety rating generator 110A, 110B generates recommendations to improve on the ratings. According to one embodiment, the billboard aesthetics and safety rating generator 110A, 110B may utilize aesthetics, safety and conformance ratings to generate recommendations as to how to improve on the previous ratings. For example, if a billboard previously received "poor" on aesthetics, safety and conformance ratings, the billboard aesthetics and safety rating generator 110A, 110B may provide written recommendations and explanations as to how a user may improve the design, location, size, etc. of the billboard so as to receive higher than "standard" ratings when the billboard aesthetics and safety rating generator 110A, 110B re-evaluates the billboard.

Figure 3:
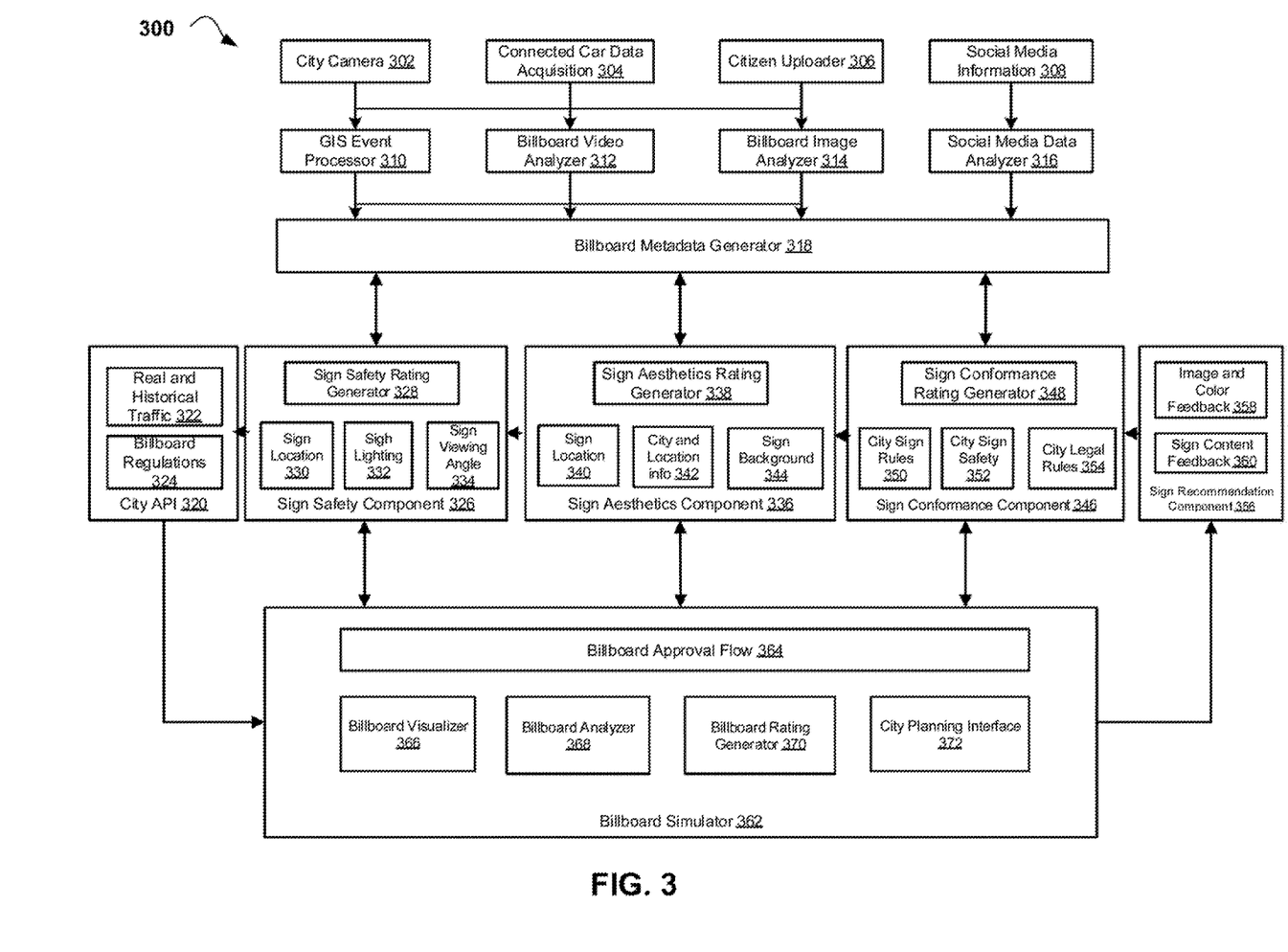
FIG. 3 is a block diagram of a billboard aesthetics and safety information generation platform according to at least one embodiment.

Referring now to FIG. 3, a block diagram of a billboard aesthetics and safety information generation platform 300 is depicted according to at least one embodiment. A billboard metadata generator 318 may receive data from a city camera 302, connected car data acquisition 304, a citizen uploader 306 and social media information 308. A GIS event processor 310 may process video data transmitted from the city camera 302. A billboard video analyzer 312 may receive video data from the connected car data acquisition 304. Likewise, a billboard image analyzer 314 may receive image data from the citizen uploader 306. A social media data analyzer 316 may receive social media information 308. Social media information 308 may include text, audio, video or any other data related to a particular billboard a user may be interested in viewing.

A sign safety component 326 may include a sign safety rating generator 328, and the sign safety rating generator 328 may analyze data related to sign location 330, sign lighting 332 and sign viewing angle 334. Once the sign safety component 326 generates a sign safety rating, the rating may be sent to the billboard metadata generator 318 and the billboard metadata generator 318 may save the rating information in a database. The sign safety component 326 may also receive the data already gathered by the billboard metadata generator 318. A sign aesthetics component may include a sign aesthetics rating generator 338 and may analyze data related to a sign location 340, city and location information 342 and sign background information 344. This data may be received from the billboard metadata generator 318. The sign conformance component 346 may include a sign conformance rating generator 348 and may analyze the data related to city sign rules 350, city sign safety information 352 and city legal rules 354. This data may be received from the billboard metadata generator 318.

A billboard simulator 362 may include a billboard approval flow 364, a billboard visualizer 368, a billboard analyzer 368, a billboard rating generator 370 and a city planning interface 372. The billboard simulator 362 may simulate the conditions around billboards such as traffic, weather, and surroundings. According to one embodiment, the billboard simulator 362 may generate a 3D model of an improved billboard design or signs utilizing the billboard visualizer 366 and the billboard analyzer 368 based on the ratings-related data generated by the sign safety component 326, the sign aesthetics component 336 and the sign conformance component 346. The billboard simulator 362 may also generate an updated rating on the improved billboards utilizing the billboard rating generator 370. The billboard simulator 362 may also transmit an approval form for a user to verify or accept the updated billboard signs through the billboard approval flow 364. The billboard simulator 362 may also include a city planning interface 372 to simulate the updated billboard in a city planning interface to see if the newly updated billboard signs conform with the future regulations or city development plans. The billboard simulator 362 may also generate a recommendation utilizing a sign recommendation component 356. The sign recommendation component 356 analyzes the recommendations and generates image and color feedback 358 and sign or content feedback 360. The sigh recommendation component 356 may send such feedback to the other three components (i.e. the sign conformance rating generator 348, the sign aesthetics rating generator 338, the sign safety rating generator 328). The billboard simulator 362 may further run the improved model of a billboard so that a user may then run the simulation to validate it. In at least one other embodiment, the sign safety component 326, the sign aesthetics component 336 and the sign conformance component 346 may interact with city APIs 320 to gather real and historical traffic data 322 and billboard regulations 324. The city API 320 may interact with the billboard simulator 362, for example, to simulate real traffic conditions around the proposed billboard or interact with the city planning interface to share critical information regarding new billboard regulation or city plans regarding roads, buildings, and certain traffic signs, etc.

It may be appreciated that FIGS. 2-3 provide only an illustration of one implementation and do not imply any limitations with regard to how different embodiments may be implemented. Many modifications to the depicted environments may be made based on design and implementation requirements. For example, in at least one embodiment, the billboard aesthetics and safety rating generator 110A, 110B may generate a 3D model and provide simulation and rating information to local authorities so that the local authorities may review the model and simulation in advance and provide their own feedback to a user before the user may finalize designing a billboard.

Figure 4:
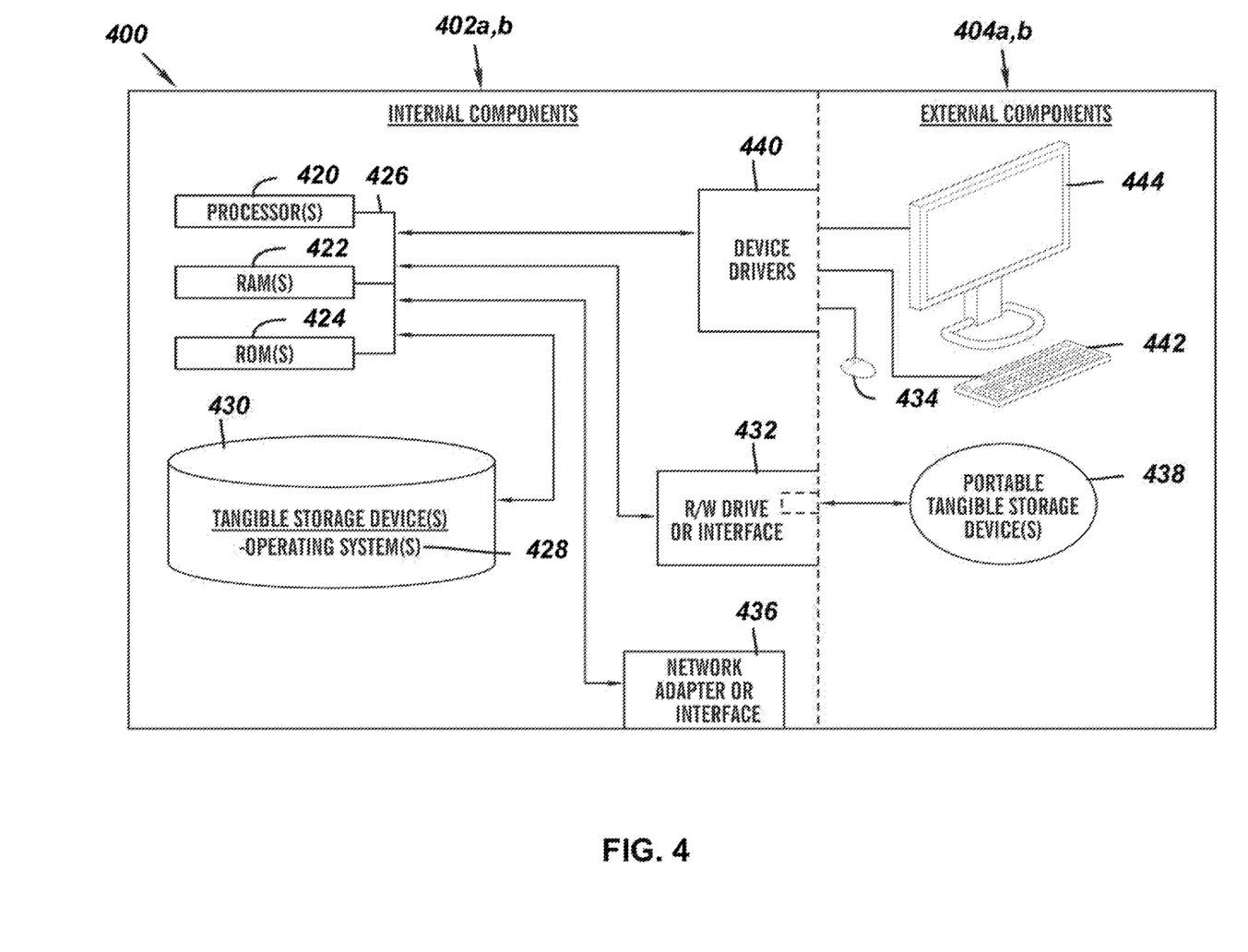
FIG. 4 is a block diagram of internal and external components of computers and servers depicted in FIG. 1 according to at least one embodiment.

FIG. 4 is a block diagram 400 of internal and external components of the client computing device 102 and the server 112 depicted in FIG. 1 in accordance with an embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

The data processing system 402, 404 is representative of any electronic device capable of executing machine-readable program instructions. The data processing system 402, 404 may be representative of a smart phone, a computer system, PDA, or other electronic devices. Examples of computing systems, environments, and/or configurations that may represented by the data processing system 402, 404 include, but are not limited to, personal computer systems, server computer systems, thin clients, thick clients, handheld or laptop devices, multiprocessor systems, microprocessor-based systems, network PCs, minicomputer systems, and distributed cloud computing environments that include any of the above systems or devices.

The client computing device 102 and the server 112 may include respective sets of internal components 402a,b and external components 404a,b illustrated in FIG. 4. Each of the sets of internal components 402 include one or more processors 420, one or more computer-readable RAMs 422, and one or more computer-readable ROMs 424 on one or more buses 426, and one or more operating systems 428 and one or more computer-readable tangible storage devices 430. The one or more operating systems 428, the software program 108 and the billboard aesthetics and safety rating generator 110A in the client computing device 102 and the billboard aesthetics and safety rating generator 110B in the server 112 are stored on one or more of the respective computer-readable tangible storage devices 430 for execution by one or more of the respective processors 420 via one or more of the respective RAMs 422 (which typically include cache memory). In the embodiment illustrated in FIG. 4, each of the computer-readable tangible storage devices 430 is a magnetic disk storage device of an internal hard drive. Alternatively, each of the computer-readable tangible storage devices 430 is a semiconductor storage device such as ROM 424, EPROM, flash memory or any other computer-readable tangible storage device that can store a computer program and digital information.

Each set of internal components 402*a,b* also includes an R/W drive or interface 432 to read from and write to one or more portable computer-readable tangible storage devices 438 such as a CD-ROM, DVD, memory stick, magnetic tape, magnetic disk, optical disk or semiconductor storage device. A software program, such as the billboard aesthetics and safety rating generator 110A, 110B can be stored on one or more of the respective portable computer-readable tangible storage devices 438, read via the respective R/W drive or interface 432 and loaded into the respective hard drive 430.

Each set of internal components 402*a,b* also includes network adapters or interfaces 436 such as a TCP/IP adapter cards, wireless Wi-Fi interface cards, or 3G or 4G wireless interface cards or other wired or wireless communication links. The software program 108 and the billboard aesthetics and safety rating generator 110A in the client computing device 102 and the billboard aesthetics and safety rating generator 110B in the server 112 can be downloaded to the client computing device 102 and the server 112 from an external computer via a network (for example, the Internet, a local area network or other, wide area network) and respective network adapters or interfaces 436. From the network adapters or interfaces 436, the software program 108 and the billboard aesthetics and safety rating generator 110A in the client computing device 102 and the billboard aesthetics and safety rating generator 110B in the server 112 are loaded into the respective hard drive 430. The network may comprise copper wires, optical fibers, wireless transmission, routers, firewalls, switches, gateway computers and/or edge servers.

Each of the sets of external components 404*a,b* can include a computer display monitor 444, a keyboard 442, and a computer mouse 434. External components 404*a,b* can also include touch screens, virtual keyboards, touch pads, pointing devices, and other human interface devices. Each of the sets of internal components 402*a,b* also includes device drivers 440 to interface to computer display monitor 444, keyboard 442, and computer mouse 434. The device drivers 440, R/W drive or interface 432, and network adapter or interface 436 comprise hardware and software (stored in storage device 430 and/or ROM 424).

It is understood in advance that although this disclosure includes a detailed description on cloud computing, implementation of the teachings recited herein is not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is a service oriented with a focus on statelessness, low coupling, modularity, and semantic interoperability. At the heart of cloud computing is an infrastructure comprising a network of interconnected nodes.

Figure 5:
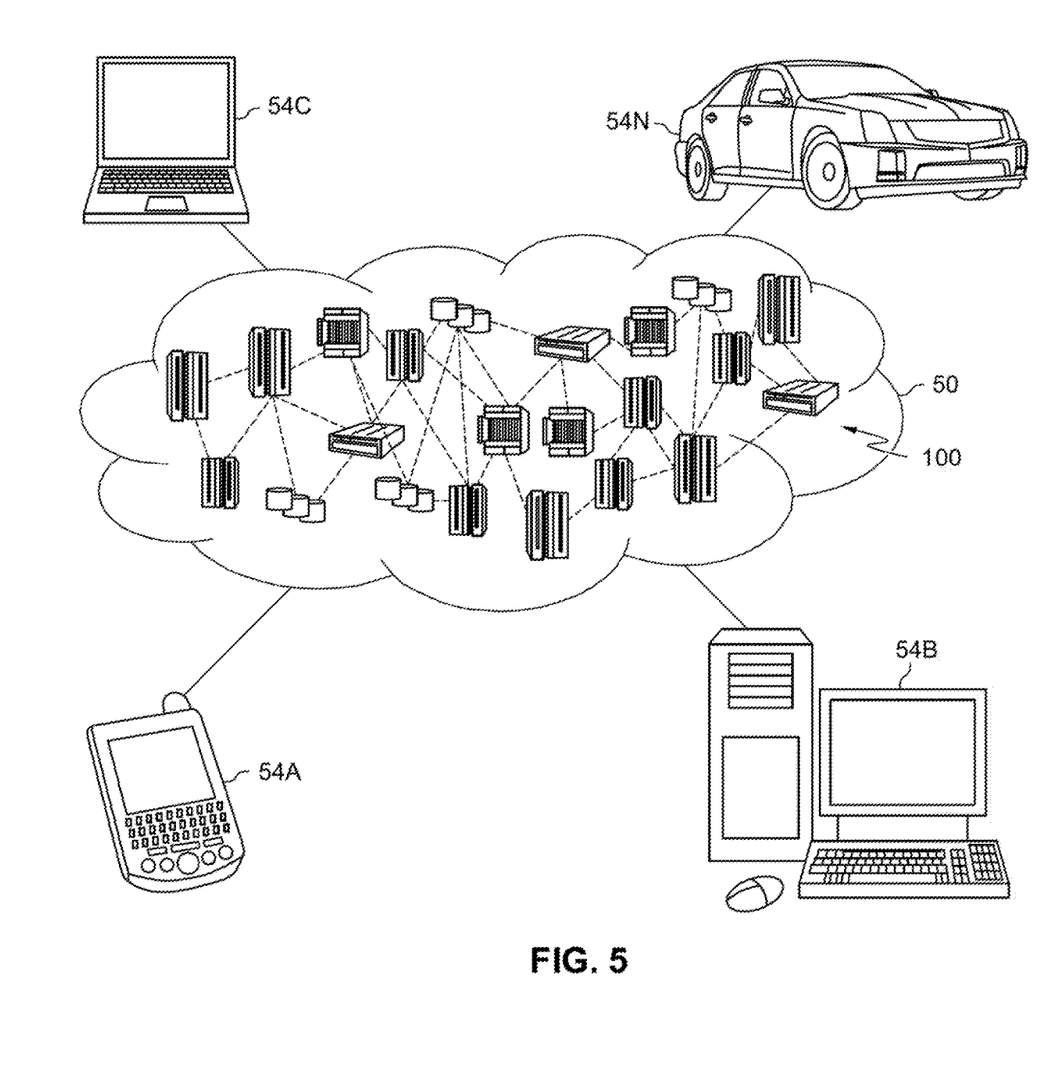
FIG. 5 depicts a cloud computing environment according to an embodiment of the present invention.

Referring now to FIG. 5, illustrative cloud computing environment 50 is depicted. As shown, cloud computing environment 50 comprises one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 100 and cloud computing environment 50 can communicate with any type of computerized device over any type of network and/or network addressable connection (e.g., using a web browser).

Figure 6:
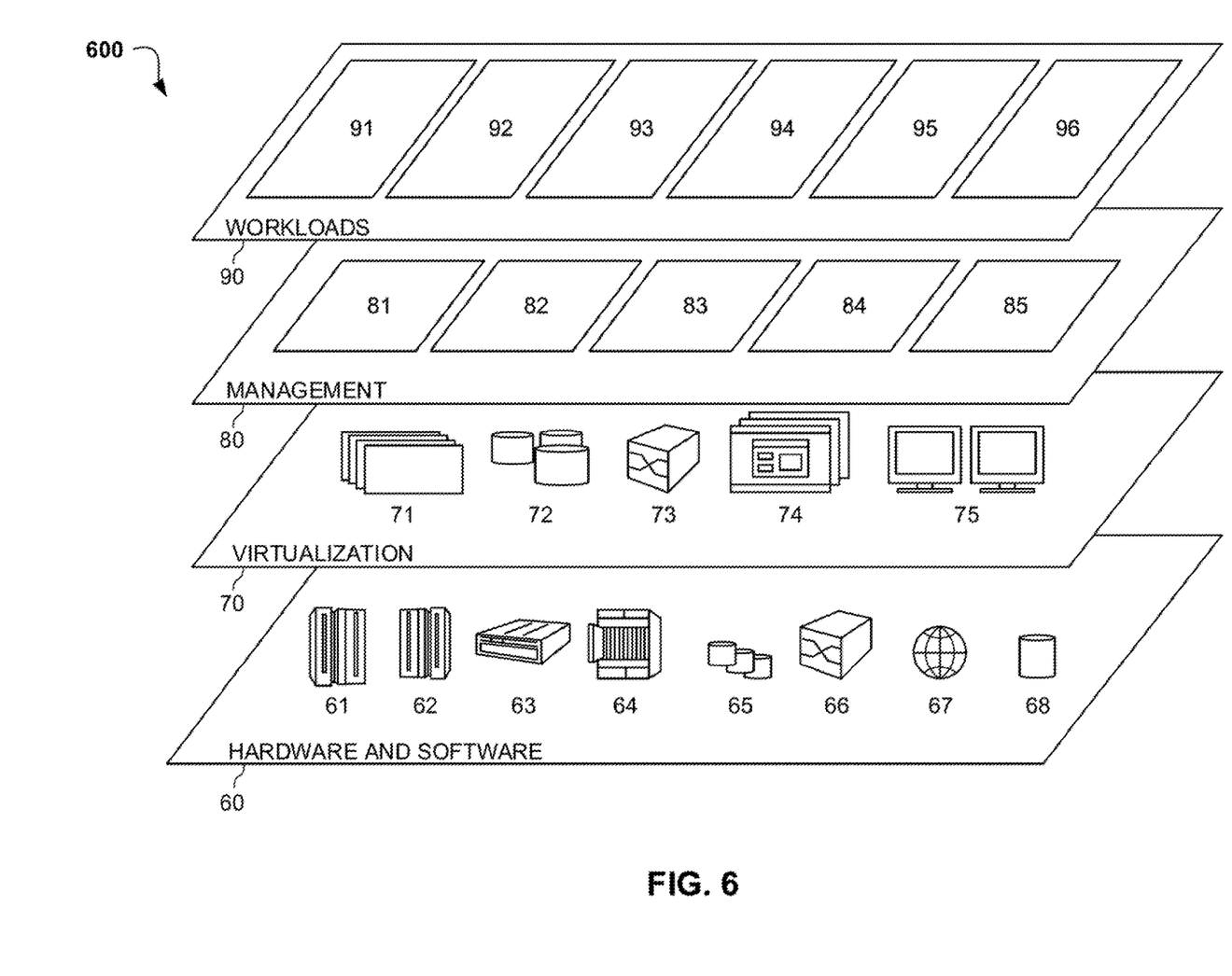
FIG. 6 depicts abstraction model layers according to an embodiment of the present invention.

Referring now to FIG. 6, a set of functional abstraction layers 600 provided by cloud computing environment 50 is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and billboard aesthetics and safety rating generation 96. Billboard aesthetics and safety rating generation 96 may relate to leveraging video, image and social media data to automatically generate sign aesthetics, safety and conformance ratings.

The descriptions of the various embodiments of the present invention have been presented for purposes of illustration but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for billboard aesthetics and safety rating generator, the method comprising:

receiving, by a processor, a plurality of information related to a billboard from cameras connected to cars, city cameras, citizen uploaders, and social media sites;

extracting specific billboard information from the received plurality of information, wherein extracting the specific billboard information comprises calculating a size of the billboard from the plurality of information, scanning words and images of the billboard from the plurality of information, and extracting a physical location of the billboard based on GPS data within the plurality of information;

generating an assessment on safety, aesthetics and legal conformance levels of the extracted billboard information, wherein the assessment on safety is generated based on a generation of a hierarchical decision model based on calculating a linear combination of coefficients associated with an attention time of a driver measured in seconds, a number of views of a billboard, traffic conditions, road design, a number of billboards in a given location, and viewing angles, and wherein one or more models corresponding to the assessment on safety are generated, a significance factor is determined for each of the coefficients corresponding to the one or more models, and a rating for the assessment on safety is determined based on a weighted average associated with the coefficients, wherein the assessment on aesthetics is generated based on a generation of multiple modules using analytics, machine learning, and deep learning models to define what an aesthetically pleasing billboard looks like based on one or more parameters such as a size of the billboard sign, content of the billboard, a significance factor associated with the location of the billboard, a local language associated with the billboard, and a location background associated with the billboard, and wherein the multiple modules continuously receive feedback to train the deep learning models based on generating a bar graph indicating a weight value corresponding to an effect each of the one or more parameters have on the assessment on aesthetics, and wherein the assessment on legal conformance levels is generated based on multiple models which gather regulatory and contractual information regarding a location and surrounding information;

generating improvement recommendations designed to increase the generated assessment associated with the safety, aesthetics and legal conformance levels by providing recommendations corresponding to a design, the location, and the size of the billboard corresponding to increasing the safety, aesthetics and legal conformance levels of the billboard based on metadata for understanding aesthetics and safety aspects associated with the billboard, wherein the improvement recommendations comprise feedback corresponding to an image, content, or colors associated with the billborad;

generating a 3D model of the billboard based on user-configured updates corresponding to the received plurality of information based on the generated improvement recommendations corresponding to the assessment and one or more safety, aesthetics and legal conformance issues discovered from the generated assessment, wherein the 3D model is configured to enable a user to define billboard dimensions, upload a new image designed for the billboard, and modify a physical environment around the billboard;

simulating conditions around the generated 3D model of the billboard to validate the generated 3D model's conformance with required assessment for user approval, wherein the conditions are simulated based on extracting, from an application programming interface, real-time data corresponding to the conditions; and providing feedback received based on the generated improvement recommendations to the safety, aesthetics and legal conformance assessments.

2. The method of claim 1, further comprising:
prompting a user, via a graphical user interface, with the generated 3D model of the billboard.

3. The method of claim 1, further comprising:
extracting commentary information about the billboard.

4. The method of claim 1, further comprising:
generating a simulation of conditions around the billboard, wherein the conditions include traffic condition, weather conditions, and surrounding buildings and roads.

5. The method of claim 1, further comprising:
generating metadata based on the received plurality of the information related to the billboard and the extracted billboard information; and
generating rich media files based on the metadata.

6. The method of claim 1, further comprising:
prompting a local authority, via a graphical user interface, with the simulation and the rating information for approval; and
updating the metadata with the local authority's feedback.

7. A computer system for billboard aesthetics and safety rating generator, the computer system comprising:
one or more processors, one or more computer-readable memories, one or more computer-readable tangible storage media, and program instructions stored on at least one of the one or more tangible storage media for execution by at least one of the one or more processors via at least one of the one or more memories, wherein the computer system is capable of performing a method comprising:

receiving, by a processor, a plurality of information related to a billboard from cameras connected to cars, city cameras, citizen uploaders, and social media sites;

extracting specific billboard information from the received plurality of information wherein extracting the specific billboard information comprises calculating a size of the billboard from the plurality of information, scanning words and images of the billboard from the plurality of information, and extracting a physical location of the billboard based on GPS data within the plurality of information;

generating an assessment on safety, aesthetics and legal conformance levels of the extracted billboard information, wherein the assessment on safety is generated based on a generation of a hierarchical decision model based on calculating a linear combination of coefficients associated with an attention time of a driver measured in seconds, a number of views of a billboard, traffic conditions, road design, a number of billboards in a given location, and viewing angles, and wherein one or more models corresponding to the assessment on safety are generated, a significance factor is determined for each of the coefficients corresponding to the one or more models, and a rating for the assessment on safety is determined based on a weighted average associated with the coefficients, wherein the assessment on aesthetics is generated based on a generation of multiple modules using analytics, machine learning, and deep learning models to define what an aesthetically pleasing billboard looks like based on one or more parameters such as a size of the billboard sign, content of the billboard, a significance factor associated with the location of the billboard, a local language associated with the billboard, and a location background associated with the billboard, and wherein the multiple modules continuously receive feedback to train the deep learning models based on generating a bar graph indicating a weight value corresponding to an effect each of the one or more parameters have on the assessment on aesthetics, and wherein the assessment on legal conformance levels is generated based on multiple models which gather regulatory and contractual information regarding a location and surrounding information;

generating improvement recommendations designed to increase the generated assessment associated with the safety, aesthetics and legal conformance levels by providing recommendations corresponding to a design, the location, and the size of the billboard corresponding to increasing the safety, aesthetics and legal conformance levels of the billboard based on metadata for understanding aesthetics and safety aspects associated with the billboard, wherein the improvement recommendations comprise feedback corresponding to an image, content, or colors associated with the billborad;

generating a 3D model of the billboard based on user-configured updates corresponding to the received plurality of information based on the generated improvement recommendations corresponding to the assessment and one or more safety, aesthetics and legal conformance issues discovered from the generated assessment, wherein the 3D model is configured to enable a user to define billboard dimensions, upload a new image designed for the billboard, and modify a physical environment around the billboard;

simulating conditions around the generated 3D model of the billboard to validate the generated 3D model's conformance with required assessment for user approval, wherein the conditions are simulated based on extracting, from an application programming interface, real-time data corresponding to the conditions; and providing feedback received based on the generated improvement recommendations to the safety, aesthetics and legal conformance assessments.

8. The computer system of claim 7, further comprising:
prompting a user, via a graphical user interface, with the generated 3D model of the billboard.

9. The computer system of claim 7, further comprising:
extracting commentary information about the billboard.

10. The computer system of claim 7, further comprising:
generating a simulation of conditions around the billboard, wherein the conditions include traffic condition, weather conditions, and surrounding buildings and roads.

11. The computer system of claim 7, further comprising:
generating metadata based on the received plurality of the information related to the billboard and the extracted billboard information; and
generating rich media files based on the metadata.

12. The computer system of claim 7, further comprising:
prompting a local authority, via a graphical user interface, with the simulation and the rating information for approval; and
updating the metadata with the local authority's feedback.

13. A computer program product for billboard aesthetics and safety rating generator, the computer program product comprising:
one or more computer-readable non-transitory tangible storage media and program instructions stored on at least one of the one or more non-transitory tangible storage media, the program instructions executable by a processor of a computer to perform a method, the method comprising:
receiving, by a processor, a plurality of information related to a billboard from cameras connected to cars, city cameras, citizen uploaders, and social media sites;
extracting specific billboard information from the received plurality of information wherein extracting the specific billboard information comprises calculating a size of the billboard from the plurality of information, scanning words and images of the billboard from the plurality of information, and extracting a physical location of the billboard based on GPS data within the plurality of information;
generating an assessment on safety, aesthetics and legal conformance levels of the extracted billboard information,
wherein the assessment on safety is generated based on a generation of a hierarchical decision model based on calculating a linear combination of coefficients associated with an attention time of a driver measured in seconds, a number of views of a billboard, traffic conditions, road design, a number of billboards in a given location, and viewing angles, and wherein one or more models corresponding to the assessment on safety are generated, a significance factor is determined for each of the coefficients corresponding to the one or more models, and a rating for the assessment on safety is determined based on a weighted average associated with the coefficients, wherein the assessment on aesthetics is generated based on a generation of multiple modules using analytics, machine learning, and deep learning models to define what an aesthetically pleasing billboard looks like based on one or more parameters such as a size of the billboard sign, content of the billboard, a significance factor associated with the location of the billboard, a local language associated with the billboard, and a location background associated with the billboard, and wherein the multiple modules continuously receive feedback to train the deep learning models based on generating a bar graph indicating a weight value corresponding to an effect each of the one or more parameters have on the assessment on aesthetics, and wherein the assessment on legal conformance levels is generated based on multiple models which gather regulatory and contractual information regarding a location and surrounding information;

generating improvement recommendations designed to increase the generated assessment associated with the safety, aesthetics and legal conformance levels by providing recommendations corresponding to a design, the location, and the size of the billboard corresponding to increasing the safety, aesthetics and legal conformance levels of the billboard based on metadata for understanding aesthetics and safety aspects associated with the billboard, wherein the improvement recommendations comprise feedback corresponding to an image, content, or colors associated with the billborad;

generating a 3D model of the billboard based on user-configured updates corresponding to the received plurality of information based on the generated improvement recommendations corresponding to the assessment and one or more safety, aesthetics and legal conformance issues discovered from the generated assessment, wherein the 3D model is configured to enable a user to define billboard dimensions, upload a new image designed for the billboard, and modify a physical environment around the billboard;

simulating conditions around the generated 3D model of the billboard to validate the generated 3D model's conformance with required assessment for user approval, wherein the conditions are simulated based on extracting, from an application programming interface, real-time data corresponding to the conditions from an application programming interface; and providing feedback received based on the generated improvement recommendations to the safety, aesthetics and legal conformance assessments.

14. The computer program product of claim 13, further comprising:
prompting a user, via a graphical user interface, with the generated 3D model of the billboard.

15. The computer program product of claim 13, further comprising:
extracting commentary information about the billboard.

16. The computer program product of claim 13, further comprising:

generating a simulation of conditions around the billboard, wherein the conditions include traffic condition, weather conditions, and surrounding buildings and roads.

17. The computer program product of claim 13, further comprising:
    generating metadata based on the received plurality of the information related to the billboard and the extracted billboard information; and
    generating rich media files based on the metadata.

\* \* \* \* \*